United States Patent
Liang et al.

(10) Patent No.: US 6,635,579 B2
(45) Date of Patent: Oct. 21, 2003

(54) OPERATING METHOD OF A SEMICONDUCTOR ETCHER

(75) Inventors: Ming-Chung Liang, Ping-Tung (TW); Shin-Yi Tsai, Hsin-Chu (TW); Hsu-Sheng Yu, Chi-Lung (TW); Chun-Hung Lee, Tao-Yuan-Hsien (TW)

(73) Assignee: Macronix International Co. Ltd., Hsin-Chu (TW)

( * ) Notice: Subject to any disclaimer, the term of this patent is extended or adjusted under 35 U.S.C. 154(b) by 59 days.

(21) Appl. No.: 09/682,556

(22) Filed: Sep. 19, 2001

(65) Prior Publication Data

US 2002/0168862 A1 Nov. 14, 2002

(30) Foreign Application Priority Data

May 11, 2001 (TW) ........................................ 90111333 A

(51) Int. Cl.⁷ ............................................. H01L 21/302
(52) U.S. Cl. ...................... 438/706; 438/710; 438/712; 438/720
(58) Field of Search ................................ 438/706, 710, 438/712, 720; 156/345.47, 345.48; 216/67, 68

(56) References Cited

U.S. PATENT DOCUMENTS

| | | | | |
|---|---|---|---|---|
| 6,060,397 A | * | 5/2000 | Seamons et al. | 438/694 |
| 6,090,718 A | * | 7/2000 | Soga et al. | 438/714 |
| 6,401,728 B2 | * | 6/2002 | Chow et al. | 134/1.1 |

* cited by examiner

*Primary Examiner*—Benjamin L. Utech
*Assistant Examiner*—Lan Vinh
(74) *Attorney, Agent, or Firm*—Winston Hsu

(57) ABSTRACT

An operating method of a semiconductor etcher includes three steps. The first step is to provide a first power for shortening a warm-up time of the etcher. The second step is to provide a second power, which is lower than the first power, to perform an etching process. The third step is to provide a third power, which is between the first and second power, for cleaning the etcher.

5 Claims, 5 Drawing Sheets

OPERATING METHOD OF A SEMICONDUCTOR ETCHER

BACKGROUND OF INVENTION

1. Field of the Invention

The present invention relates to an operating method of a semiconductor etcher, and more particularly, to an operating method in which a time for warming up the semiconductor etcher is reduced, thereby allowing the semiconductor etcher to etch wafers more rapidly.

2. Description of the Prior Art

Technologies used for semiconductor etchers can be roughly divided into two groups, dry etching technology and wet etching technology. Compared to semiconductor etchers using the wet etching technology, the dry etching technology can be controlled appropriately during an etching process, and patterns on an optical resistor can be very accurately transferred to wafers. As a result, dry etching technology for semiconductor etchers is more suitable for manufacturing of very large scale integrated circuits (VLSI) and ultra large scale integrated circuits (ULSI).

Dry etching technology takes advantage of a radio frequency power source to generate plasmas, leading to glow discharges, and producing reactive materials for etching wafers, according to initial settings.

Semiconductor etchers adopt plasmas for etching because plasmas provide a unique and a controllable energy form that can fit into small spaces used in semiconductor manufacturing processes. The plasmas can be produced by interaction from different energy forms. In semiconductor manufacturing, the plasmas are produced by energy from an electric field of a magnetic field, so that kinetic energy of electrons is enough to overcome needed energy for ionization.

Please refer to FIG. 1. FIG. 1 is a diagram of a prior art transformer coupled plasma (TCP) semiconductor etcher 10. The semiconductor etcher 10 comprises a bottom substrate 12, a side wall 14, a top substrate 16, and a vacuum room 17 enclosed by the bottom substrate 12, the side wall 14 and the top substrate 16. The semiconductor etcher 10 further comprises an induction coil 18 set above the top substrate 16, a dielectric board 19 set between the induction coil 18 and the top substrate 16, a wafer supporting frame 22 for supporting a wafer during an etching process, a radio frequency power source 24 set within the induction coil 18, and a bias source 26 electrically connected to the wafer supporting frame 22. When air is transmitted into the vacuum room 17, the air is ionized to produce plasmas that are used in an etching process.

When the etcher 10 is switched on, the radio frequency power source 24 provides constant power to the etcher 10 for performing a warm-up process over a determined period of time. Then, the radio frequency power source 24 provides the same constant power to the etcher 10 when performing an etching process. In the prior art, because the provided power is the same for both the warm up process and the etching process, the etcher 10 needs a long period of warm up time.

Magnitude of the provided power during the warm up process can affect a period of time of the etcher achieving initialization. If the warm up time is not enough to continue to perform the etching process, electric characteristics are different between a pre-over wafer and a post-over wafer after the etching process. This is called characteristic drift.

Please refer to FIG. 1, FIG. 2 and FIG. 3. FIG. 2 is a relationship diagram of an etching rate to time when a semiconductor etcher 10 is switched on as shown in FIG. 1. FIG. 3 is a diagram of provided power and time in each operating step 30 when a semiconductor etcher is switched on as shown in FIG. 1.

As FIG. 3 shows, when the etcher 10 is switched on, the etcher 10 performs a warm up process 32 that provides a time interval 840 seconds and power 800 watts, then performs a cleaning process 36 that provides a time interval 60 seconds and power 800 watts, and finally performs an etching process 34 to provide a time interval 210 seconds and power 600~700 watts. As transverse dotted lines show in FIG. 2, after passing through a time point 24, an etched wafer of the etcher 10 falls on a required range and cannot have characteristic drift. In semiconductor manufacturing, much time is wasted performing the warm-up process.

SUMMARY OF INVENTION

It is therefore a primary objective of the present invention to provide an operating method that lowers a warm-up time for a semiconductor etcher, thereby increasing a number of wafers the semiconductor etcher can etch in a given period of time.

The present invention discloses an operating method of a semiconductor etcher comprising the following steps. First, provide a first power for shortening warm-up time of the etcher. Next, provide a second power, which is lower than the first power, to perform an etching process. Then, provide a third power, which is between the first and second power, for cleaning the etcher.

It is an advantage of the present invention that the present operating method of the semiconductor etcher provides a shorter warm up time and higher processing efficiency.

These and other objectives and advantages of the present invention will no doubt become obvious to those of ordinary skill in the art after reading the following detailed description of the preferred embodiment that is illustrated in the various figures and drawings.

BRIEF DESCRIPTION OF DRAWINGS

FIG. 2 is a relationship diagram of an etching rate vs. time when the semiconductor etcher of FIG. 1 is switched on.

FIG. 3 is a diagram of provided power and time in each operating step when the semiconductor etcher of FIG. 1 is switched on.

FIG. 4 is a relationship diagram of an etching rate vs. time when a semiconductor etcher under the operating method of the present invention is switched on.

FIG. 5 is a diagram of a present invention operating method of provided power and time in each operating step when the semiconductor etcher is switched on.

DETAILED DESCRIPTION

Figure 1:
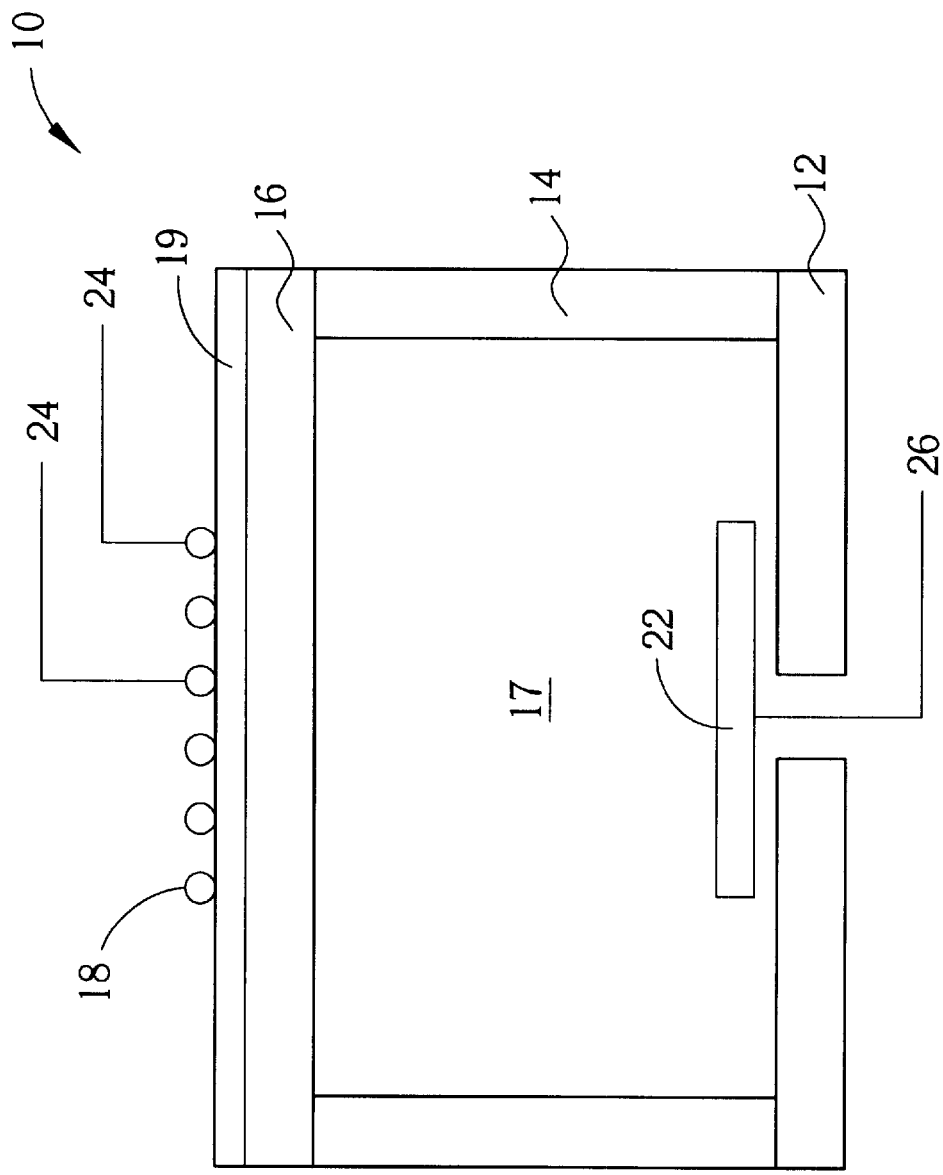
FIG. 1 is a diagram of a prior art transformer coupled plasma (TCP) semiconductor etcher.
Figure 2:
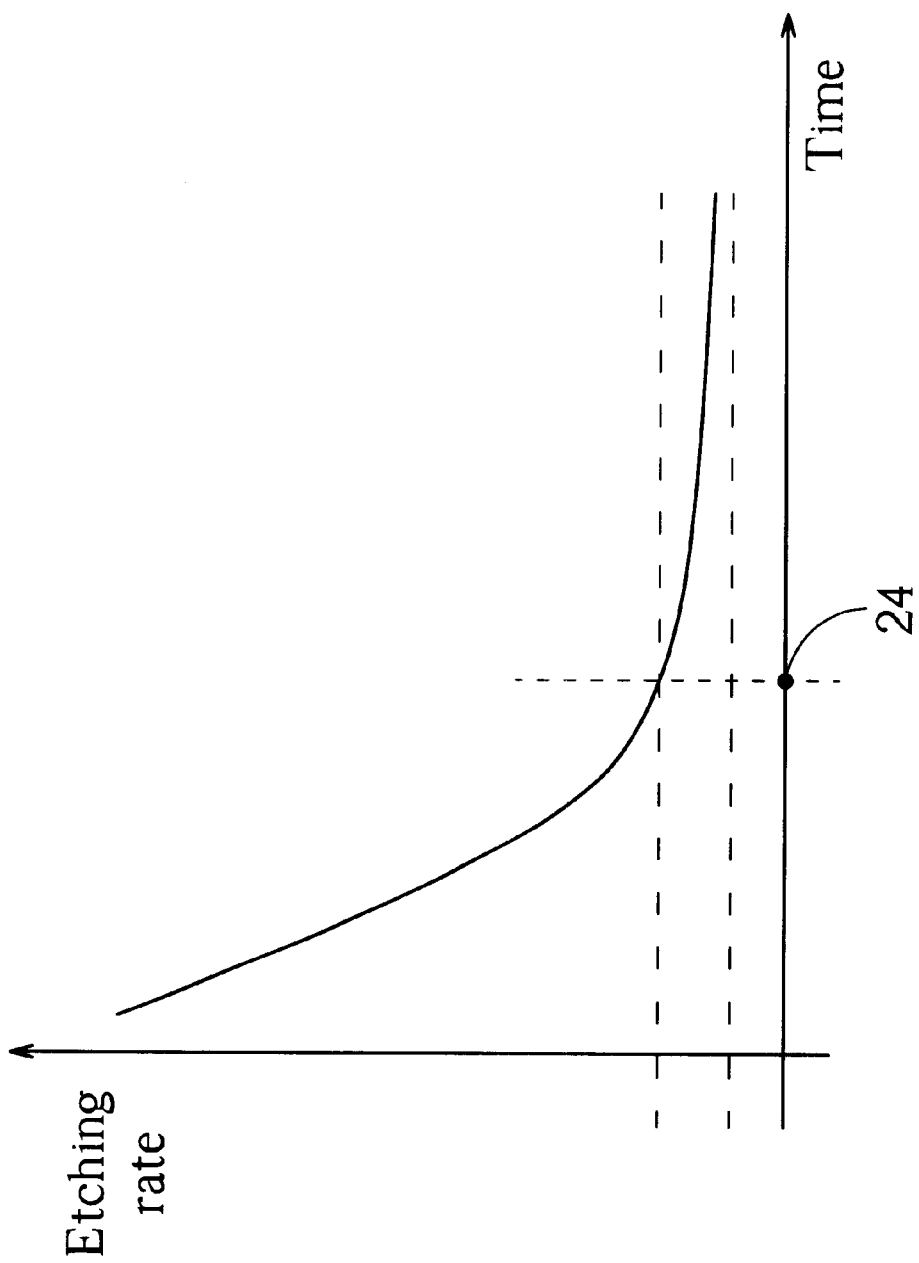
Figure 3:
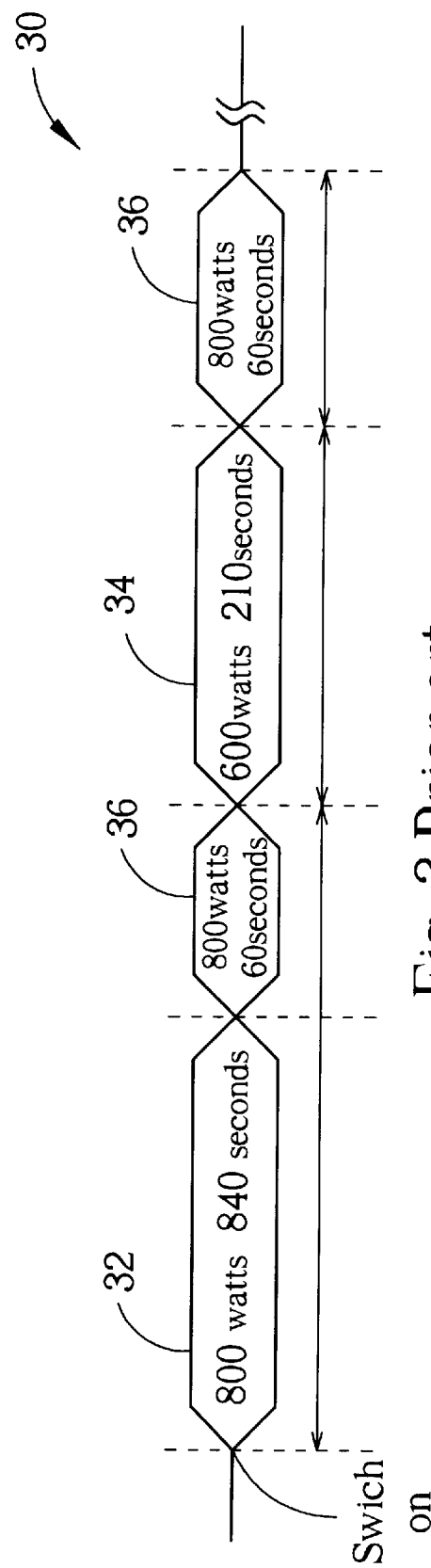
Figure 4:
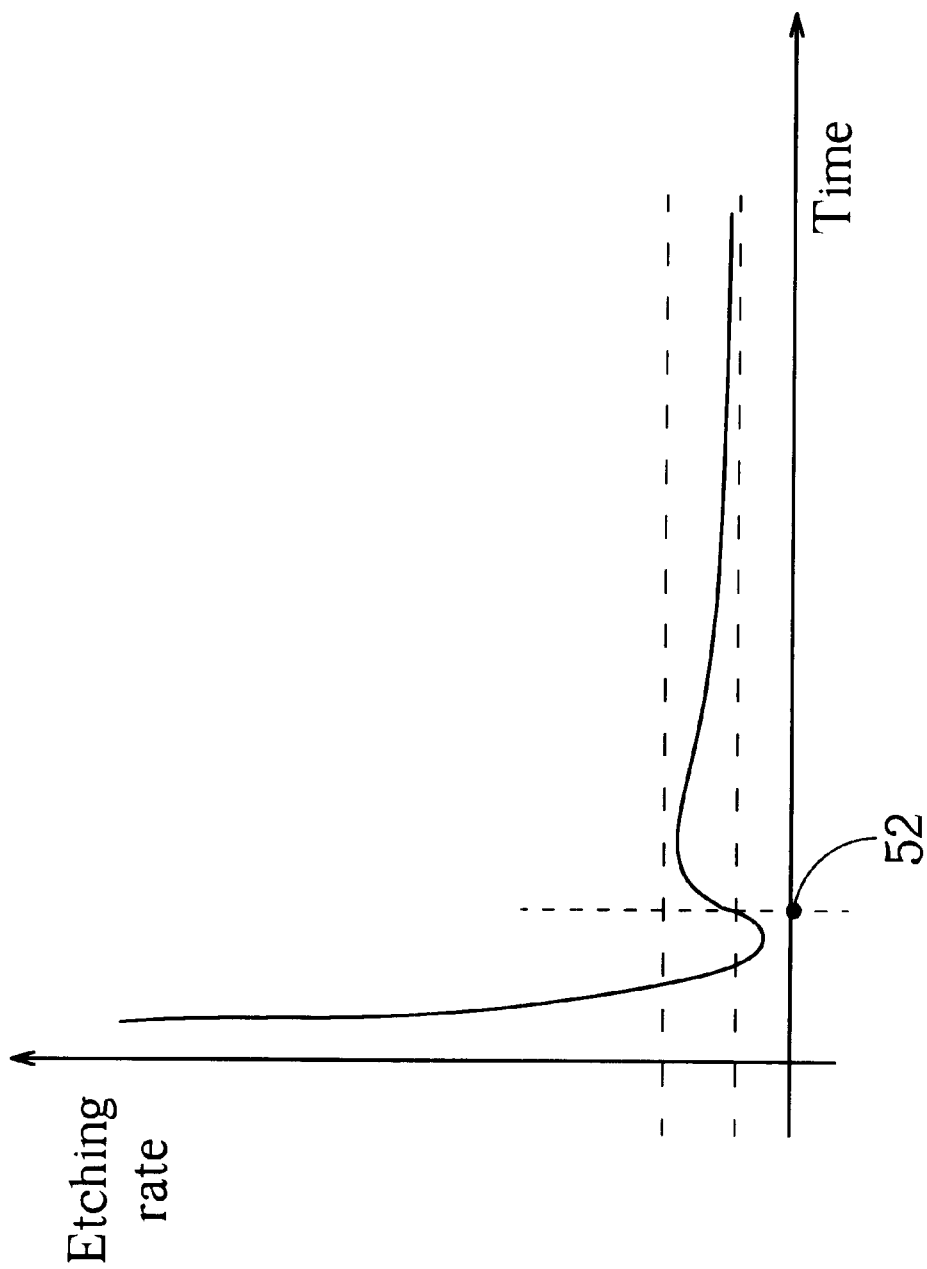

Please refer to FIG. 4. FIG. 4 is a relationship diagram of a present operating method of an etching rate to time when a semiconductor etcher is switched on. The present operating method of the semiconductor etcher is to provide a warm-up stage, then to perform etching. The power used in the warm-up stage is greater than the power used in the etching stage, so that time spent in the warm-up stage is reduced.

As transverse dotted lines show in FIG. 4, after passing through a time point 52, an etched wafer of the etcher is at a required range and will not have characteristic drift. So, the etcher is rapidly warmed up to perform the etching process.

Figure 5:
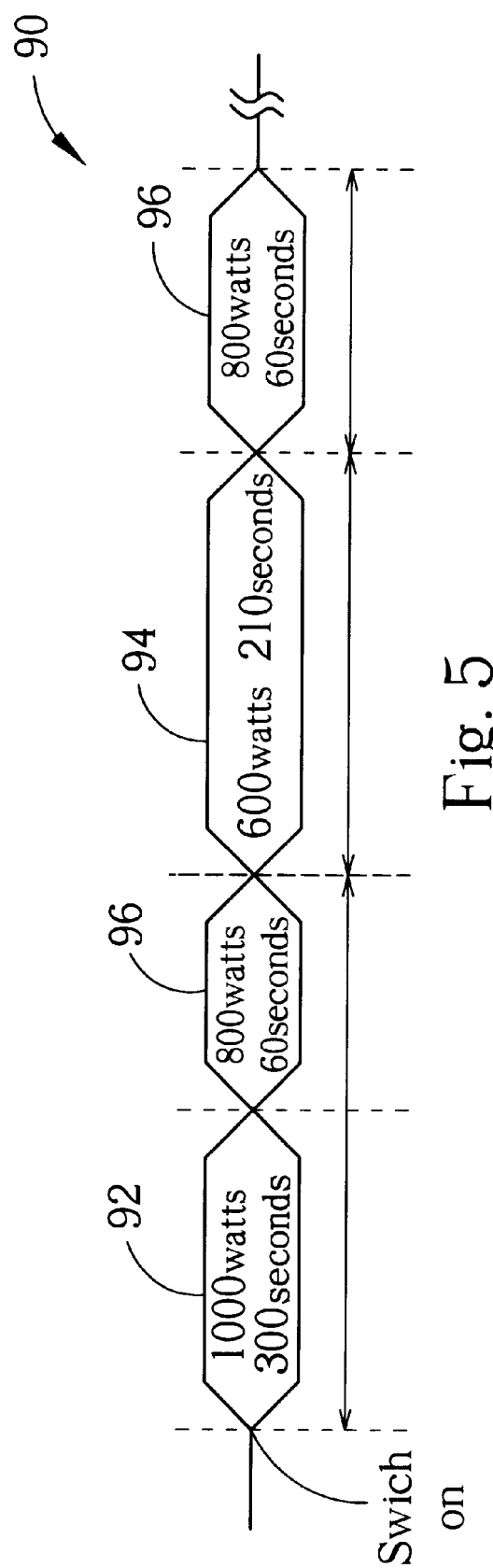

Please refer to FIG. 5. FIG. 5 is a diagram of a present invention operating method of provided power and time in each operating step when a semiconductor etcher is switched on. The present operating method 90 provides the first power to the etcher for shortening warm-up time 92 of the etcher, a second power to the etcher for performing the etching process 94, and a third power to the etcher for cleaning 96 the etcher.

As shown in FIG. 5, a major difference between the prior art and the present invention is that the operating method 90 of the present invention provides the first power 90, ranging between 900~1000 watts (usually using 1000 watts), for performing the warm up time 92 of the etcher, where the operating method of the prior art only provides 800 watts. So, where the prior art needs 840 seconds to perform the warm up process, the present invention operating method 90 needs only 300 seconds. The third power ranges between 700~900 watts (usually using 800 watts), and is provided to the etcher for performing an etching process after cleaning the etcher. The second power ranges between 600~700 watts (usually using 600 watts), and is provided to the etcher for performing the etching process. The third power is between the first and the second power to the etcher.

In contrast to the prior art, the present invention operating of the semiconductor etcher provides larger power for shortening warm up time of the etcher, so that throughput of wafers is substantially enhanced.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An operating method of a semiconductor etcher comprising:

providing first power to the etcher for shortening warm up time of the etcher;

providing second power which is lower than the first power to the etcher for performing an etching process; and providing third power which is between the first and second power to the etcher for cleaning the etcher;

wherein the etcher is warmed up before cleaning the etcher and performing the etching process.

2. The operating method of claim 1 wherein the first power is between 900~1000 watts.

3. The operating method of claim 1 wherein the second power is between 600~700 watts.

4. The operating method of claim 1 wherein the third power is between 700~900 watts.

5. The operating method of claim 1 wherein the etching process is performed after cleaning the etcher.

* * * * *